(12) United States Patent
Huang et al.

(10) Patent No.: US 9,853,099 B1
(45) Date of Patent: Dec. 26, 2017

(54) DOUBLE DIFFUSED METAL OXIDE SEMICONDUCTOR DEVICE AND MANUFACTURING METHOD THEREOF

(71) Applicant: RICHTEK TECHNOLOGY CORPORATION, Chupei, HsinChu (TW)

(72) Inventors: Tsung-Yi Huang, HsinChu (TW); Chu-Feng Chen, HsinChu (TW)

(73) Assignee: RICHTEK TECHNOLOGY CORPORATION, Chupei, Hsinchu (TW)

( * ) Notice: Subject to any disclaimer, the term of this patent is extended or adjusted under 35 U.S.C. 154(b) by 0 days.

(21) Appl. No.: 15/490,626

(22) Filed: Apr. 18, 2017

Related U.S. Application Data

(60) Provisional application No. 62/398,103, filed on Sep. 22, 2016.

(30) Foreign Application Priority Data

Jan. 16, 2017 (TW) .............................. 106101340 A

(51) Int. Cl.
- *H01L 29/06* (2006.01)
- *H01L 29/66* (2006.01)
- *H01L 29/78* (2006.01)
- *H01L 29/10* (2006.01)

(52) U.S. Cl.
CPC ...... *H01L 29/0611* (2013.01); *H01L 29/0649* (2013.01); *H01L 29/1095* (2013.01); *H01L 29/66712* (2013.01); *H01L 29/7802* (2013.01)

(58) Field of Classification Search
None
See application file for complete search history.

(56) References Cited

U.S. PATENT DOCUMENTS

| 2012/0241862 A1* | 9/2012 | Zhang ................... H01L 29/407 257/339 |
| 2016/0240660 A1 | 8/2016 | Yue et al. | |

\* cited by examiner

*Primary Examiner* — Angel Roman
*Assistant Examiner* — Kevin Quinto
(74) *Attorney, Agent, or Firm* — Tung & Associates

(57) ABSTRACT

The present invention provides a DMOS device and a manufacturing method thereof. The DMOS device includes: a substrate, an epitaxial layer, a high voltage well, a body region, a gate, a source, a drain, a drift buried region and a buried region. A first PN junction is formed between the high voltage well and an upper surface of the substrate. From a cross-section view, along the channel direction, a second PN junction is formed between the drift buried region and the buried region or formed between the high voltage well and the buried region. Along the channel direction, the first PN junction and the second PN junction have respective depths. The depth is defined as a distance extending from the upper face of the epitaxial layer downward along a vertical direction. The depth of the second PN junction is shallower than the depth of the first PN junction.

10 Claims, 6 Drawing Sheets

DOUBLE DIFFUSED METAL OXIDE SEMICONDUCTOR DEVICE AND MANUFACTURING METHOD THEREOF

CROSS REFERENCE

The present invention claims priority to U.S. provisional application 62/398,103, filed on Sep. 22, 2016, and also claims priority to TW 106101340, filed on Jan. 16, 2017.

BACKGROUND OF THE INVENTION

Field of Invention

The present invention relates to a double diffused metal oxide semiconductor (DMOS) device and a manufacturing method thereof; particularly, it relates to such DMOS device having an increased breakdown voltage when the DMOS device is in a non-conduction operation and having a reduced conduction resistance when the DMOS device is in a conduction operation, and a manufacturing method of the DMOS device.

Description of Related Art

Please refer to FIG. 1, which shows a schematic diagram of a cross-section view of a prior art N-type DMOS device. As shown in FIG. 1, the prior art N-type DMOS device 100 comprises: a substrate 17, an isolation oxide region 13, a high voltage well 15, a body region 16, a body contact region 16a, a source 18, a drain 19 and a gate 11. The high voltage well 15 has an N-type conductive type and is formed in the substrate 17 which has a P-type conductive type. The isolation oxide region 13 has a local oxidation of silicon (LOCOS) structure, which defines an operation region 13a as a major active region of the N-type DMOS device 100. The operation region 13a is shown in FIG. 1 as a region defined by two arrows.

The prior art N-type DMOS device 100 has the following drawback. During operation of this prior art N-type DMOS device 100, the substrate 17 is electrically connected to ground level (not shown), and the high voltage well 15 is at a high voltage level; therefore in a conduction operation, the high voltage well 15 in the operation region 13a will be completely depleted. As a result, the conduction resistance is high, which undesirably restricts the operation speed and operation performance of the prior art N-type DMOS device 100.

There is another prior art which proposed to form a reduced surface field (RESURF); the RESURF effect suppresses the high electric field when the prior art DMOS device is in a non-conduction operation, to increase the breakdown voltage of the prior art DMOS device. Nevertheless, although this prior art approach increases the breakdown voltage of the prior art DMOS device, it correspondingly increases the conduction resistance of the DMOS device as well, which still undesirably restricts the operation speed and operation performance of the prior art DMOS device.

In view of the above, to overcome the drawbacks in the prior art, the present invention proposes a DMOS device and a manufacturing method of the DMOS device, which are capable of increasing the breakdown voltage of the DMOS device when the DMOS device is in a non-conduction operation and reducing a conduction resistance of the DMOS device when the DMOS device is in a conduction operation.

SUMMARY OF THE INVENTION

From one perspective, the present invention provides a double diffused metal oxide semiconductor (DMOS) device, comprising: a substrate having a first conductive type, the substrate having a top surface and a bottom surface opposing to each other along a vertical direction; an epitaxial layer, which is formed on the substrate, and has an epitaxial surface opposite to the top surface along the vertical direction, wherein the epitaxial layer is stacked on and in contact with at least a portion of the top surface of the substrate; a high voltage well having a second conductive type, which is formed in the epitaxial layer, and is stacked on and in contact with the top surface along the vertical direction, wherein the high voltage well and the top surface of the substrate form a first PN junction; a body region having the first conductive type, which is formed in the epitaxial layer beneath the epitaxial surface, and connects the epitaxial surface in the vertical direction, wherein, as seen from a cross-section view, the body region and the high voltage well form a channel junction in a channel direction; a gate, which is formed on the epitaxial layer, and is stacked on and in contact with the epitaxial surface in the vertical direction, wherein, as seen from the cross-section view, the gate covers at least a part of the channel junction; a source having the second conductive type, which is formed in the epitaxial layer, and is stacked beneath and connects the epitaxial surface in the vertical direction, wherein, as seen from the cross-section view, the source is located in the body region; a drain having the second conductive type, which is formed in the epitaxial layer, and is beneath and connects the epitaxial surface in the vertical direction, wherein the source and the drain are located at different sides of the channel junction, and wherein, as seen from the cross-section view, the drain and the gate are separated by the high voltage well; a drift buried region having the second conductive type, which is formed in the epitaxial layer, wherein, as seen from the cross-section view, a part of the drift buried region is located vertically under the drain, and wherein a length of the drift buried region is greater than or equal to a length of the drain; and a buried region having the first conductive type, which is formed between the substrate and the epitaxial layer, wherein a part of the buried region is located in the substrate and another part of the buried region is located in the epitaxial layer in the vertical direction, wherein, as seen from the cross-section view, at least a part of the buried region is located vertically under the drift buried region, and wherein a length of the buried region is greater than or equal to a length of the drain, and wherein the length of the buried region is greater than or equal to a length of the drift buried region; wherein, as seen from the cross-section view, the drift buried region and the buried region, or the high voltage well and the buried region, form a second PN junction along a channel direction; wherein, as seen from the cross-section view, the first PN junction and the second PN junction have respective depths, wherein the depth is defined as a distance extending from the epitaxial surface downward along the vertical direction, and the depth of the second PN junction is shallower than the depth of the first PN junction; wherein, the drift buried region, along the channel direction, has a first boundary close to the gate and a second boundary away from the gate, and wherein, the buried region, along the channel direction, has a third boundary close to the gate and a fourth boundary away from the gate; wherein, the first boundary and the third boundary, along the channel direction, are between the drain and the channel junction, and wherein the second boundary and the fourth boundary, along the channel direction, at least extend beyond a fifth boundary, in which the fifth boundary is between the drain and an isolation structure close to the drain; wherein, the isolation structure defines an operation region of the DMOS device.

In one embodiment, the DMOS device further comprises: a field oxide region, which is formed in the operation region and on the epitaxial layer, and is stacked on and in contact with the high voltage well in the vertical direction, wherein the field oxide region is located between the channel junction and the drain in the channel direction.

In one embodiment, the DMOS device further comprises: a body contact region having the first conductive type, which is formed in the epitaxial layer, and is stacked beneath and connects the epitaxial surface in the vertical direction, wherein, as seen from the cross-section view, the body contact region is located in the body region.

From another perspective, the present invention provides a manufacturing method of a double diffused metal oxide semiconductor (DMOS) device, comprising: providing a substrate having a first conductive type, the substrate having a top surface and a bottom surface opposing to each other along a vertical direction; forming an epitaxial layer on the substrate, wherein the epitaxial layer has an epitaxial surface opposite to the top surface along the vertical direction, and wherein the epitaxial layer is stacked on and in contact with at least a portion of the top surface of the substrate; forming a high voltage well having a second conductive type in the epitaxial layer, wherein the high voltage well is stacked on and in contact with the top surface along the vertical direction, wherein the high voltage well and the top surface of the substrate form a first PN junction; forming a body region having the first conductive type in the epitaxial layer, wherein the body region is beneath the epitaxial surface and connects the epitaxial surface in the vertical direction, wherein, as seen from a cross-section view, the body region and the high voltage well form a channel junction in a channel direction; forming a gate on the epitaxial layer, wherein the gate is stacked on and in contact with the epitaxial surface in the vertical direction, wherein, as seen from the cross-section view, the gate covers at least a part of the channel junction; forming a source having the second conductive type in the epitaxial layer, wherein the source is stacked beneath and connects the epitaxial surface in the vertical direction, wherein, as seen from the cross-section view, the source is located in the body region; forming a drain having the second conductive type in the epitaxial layer, wherein the drain is beneath and connects the epitaxial surface in the vertical direction, wherein the source and the drain are located at different sides of the channel junction, and wherein, as seen from the cross-section view, the drain and the gate are separated by the high voltage well; forming a drift buried region having the second conductive type in the epitaxial layer, wherein, as seen from the cross-section view, a part of the drift buried region is located vertically under the drain, and wherein a length of the drift buried region is greater than or equal to a length of the drain; and forming a buried region having the first conductive type between the substrate and the epitaxial layer, wherein a part of the buried region is located in the substrate and another part of the buried region is located in the epitaxial layer in the vertical direction, wherein, as seen from the cross-section view, at least a part of the buried region is located vertically under the drift buried region, and wherein a length of the buried region is greater than or equal to a length of the drain, and wherein the length of the buried region is greater than or equal to a length of the drift buried region; wherein, as seen from the cross-section view, the drift buried region and the buried region or the high voltage well and the buried region form a second PN junction along a channel direction; wherein, as seen from the cross-section view, the first PN junction and the second PN junction have respective depths, wherein the depth is defined as a distance extending from the epitaxial surface downward along the vertical direction, and the depth of the second PN junction is shallower than the depth of the first PN junction; wherein, the drift buried region, along the channel direction, has a first boundary close to the gate and a second boundary away from the gate, and wherein, the buried region, along the channel direction, has a third boundary close to the gate and a fourth boundary away from the gate; wherein, the first boundary and the third boundary, along the channel direction, are between the drain and the channel junction, and wherein the second boundary and the fourth boundary, along the channel direction, at least extend beyond a fifth boundary, in which the fifth boundary is between the drain and an isolation structure close to the drain; wherein, the isolation structure defines an operation region of the DMOS device.

In one embodiment, the manufacturing method of the DMOS device further comprises: forming a field oxide region in the operation region on the epitaxial layer, wherein the field oxide region is stacked on and in contact with the high voltage well in the vertical direction, wherein the field oxide region is located between the channel junction and the drain.

In one embodiment, the manufacturing method of the DMOS device further comprises: forming a body contact region having the first conductive type in the epitaxial layer, wherein the body contact region is stacked beneath and connects the epitaxial surface in the vertical direction, wherein, as seen from the cross-section view, the body contact region is located in the body region.

In one embodiment, a concentration of the second conductive type impurities of the drift buried region is higher than a concentration of the second conductive type impurities of the high voltage well, and wherein a concentration of the first conductive type impurities of the buried region is higher than a concentration of the first conductive type impurities of the substrate.

In one embodiment, the first boundary and the third boundary are located vertically under a region which is beneath of the field oxide region.

The objectives, technical details, features, and effects of the present invention will be better understood with regard to the detailed description of the embodiments below, with reference to the attached drawings.

DESCRIPTION OF THE PREFERRED EMBODIMENTS

The above and other technical details, features and effects of the present invention will be better understood with regard to the detailed description of the embodiments below, with reference to the drawings. The drawings as referred to throughout the description of the present invention are for illustration only, to show the interrelations between the regions and the process steps, but not drawn according to actual scale.

Figure 1:
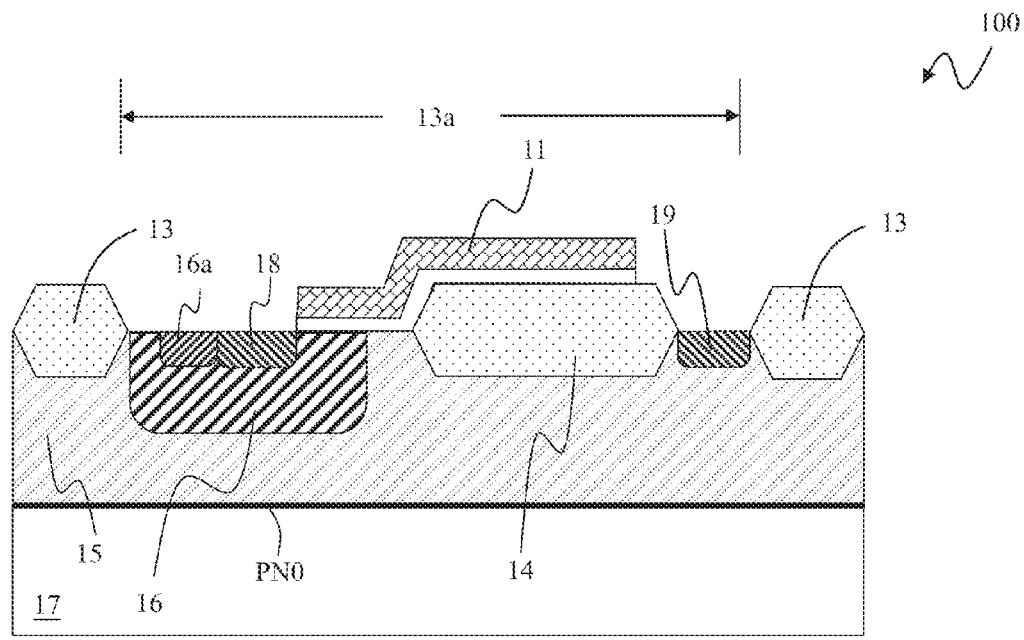
FIG. 1 shows a schematic diagram of a cross-section view of a prior art N-type DMOS device.
Figure 2:
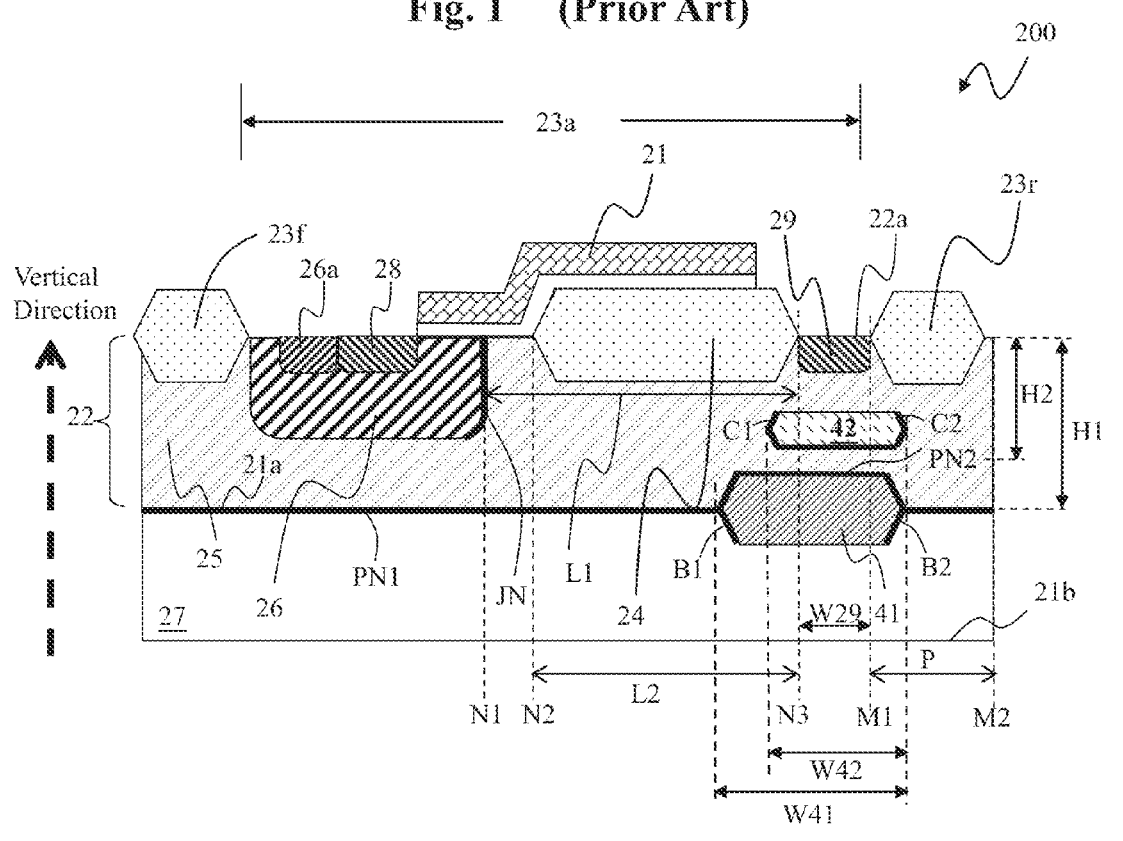
FIG. 2 shows a schematic diagram of a cross-section view of an embodiment of a DMOS device according to the present invention.

FIG. 2 shows a schematic diagram of a cross-section view of an embodiment of a DMOS device according to the present invention. This embodiment is illustrated by taking an N-type double diffused metal oxide semiconductor (DMOS) device as an example.

As shown in FIG. 2, the DMOS device 200 comprises: a substrate 27, an epitaxial layer 22, an isolation structure 23f, an isolation structure 23r, a high voltage well 25, a body region 26, a field oxide region 24, a body contact region 26a, a buried region 41, a drift buried region 42, a source 28, a drain 29, and a gate 21. It is noteworthy that the present invention is different from the prior art in that: because the present invention comprises the buried region 41 and the drift buried region 42, a PN junction PN2 having a relatively shallower depth will be formed between the drift buried region 42 and the buried region 41 or between the high voltage well 25 and the buried region 41 ("relatively shallower" is relative to the PN junction PN1). The prior art, however, does not have a PN junction PN2 having a relatively shallower depth as the present invention does (the features and the technical details of the buried region 41, the drift buried region 42 and the PN junction PN2 will be described in detail later).

The substrate 27 having a first conductive type (for example but not limited to P-type) includes a top surface 21a and a bottom surface 21b opposite to the top surface 21a in a vertical direction (as shown by the dash arrow in the figure). The epitaxial layer 22 is formed on the substrate 27 by an epitaxial process step; along the vertical direction, the epitaxial layer 22 is stacked on and in contact with the top surface 21a of the substrate 27. The epitaxial layer 22 includes an epitaxial top surface 22a opposite to the top surface 21a. The isolation structure 23f and the isolation structure 23r are formed for example but not limited by local oxidation of silicon (LOCOS) structure, which are formed on the epitaxial layer 22, for defining an operation region 23a as a major active region when the DMOS device 200 operates, wherein the body region 26, the source 28, and the drain 29 are all located in the operation region 23a from the cross-section view of FIG. 2. The high voltage well 25 having a second conductive type (for example but not limited to N-type) is formed in the epitaxial layer 22, and is stacked on and in contact with the top surface 21a of the substrate 27 in the vertical direction. In this embodiment, because the substrate 27 has a first conductive type (for example but not limited to P-type), while the high voltage well 25 has a second conductive type (for example but not limited to N-type), a PN junction PN1 is formed between the high voltage well 25 and the top surface 21a of the substrate 27. If desired, at the upper part of the substrate 27, a deep well of the first conductive type can be optionally formed (not shown), to adjust the characteristic of the PN junction.

The body region 26 having the first conductive type (for example but not limited to the P-type) is formed in the epitaxial layer 22 beneath the epitaxial surface 22a, and connects the epitaxial surface 22a in the vertical direction, wherein the body region 26 and the high voltage well 25 form a channel junction JN (as indicated by a thick solid line shown in FIG. 2) in a channel direction (as indicated by a solid arrow in the lower part of FIG. 2). The gate 21 is formed on the epitaxial layer 22, and is stacked on and in contact with the epitaxial surface 22a in the vertical direction, wherein the gate 21 covers at least a part of the channel junction JN as shown in the cross-section view of FIG. 2; for example, in this embodiment, the gate 21 covers all of the channel junction JN. The source 28 having the second conductive type (for example but not limited to the N-type) is formed in the epitaxial layer 22, and is stacked beneath and connects the epitaxial surface 22a in the vertical direction, wherein the source 28 is located in the body region 26 as shown in the cross-section view of FIG. 2. The drain 29 having the second conductive type (for example but not limited to the N-type) is formed in the epitaxial layer 22, and is beneath and connects the epitaxial surface 22a. The drain 29 and the source 28 are located at different sides of the channel junction JN, and the drain 29 and the gate 21 are separated by the high voltage well 25 as shown in the cross-section view of FIG. 2.

The field oxide region 24 is formed in the operation region 23a and on the epitaxial layer 22, and is stacked on and in contact with the high voltage well 25 in the vertical direction. The field oxide region 24 is located between the channel junction JN and the drain 29 in the channel direction.

The body contact region 26a having the first conductive type (for example but not limited to the P-type) is formed in the epitaxial layer 22, and is stacked beneath and connects the epitaxial surface 22a. As shown in the cross-section view of FIG. 2, the body contact region 26a is located in the body region 26 and functions as an electrical contact point for the body region 26.

The drift buried region 42 having the second conductive type (for example but not limited to the N-type) is formed in the epitaxial layer 22. In one embodiment, a concentration of the second conductive type (for example but not limited to the N-type) impurities of the drift buried region 42 is higher than a concentration of the second conductive type (for example but not limited to the N-type) impurities of the high voltage well 25. As seen from the cross-section view of FIG. 2, a part of the drift buried region 42 is located vertically under the drain 29. Moreover, note that in this embodiment, a length W42 of the drift buried region 42 is greater than a length W29 of the drain 29. However, in another embodiment, it is also practicable and within the scope of the present invention that the length W42 of the drift buried region 42 can be equal to the length W29 of the drain 29.

The buried region 41 having the first conductive type (for example but not limited to the P-type) is formed between the substrate 27 and the epitaxial layer 22. In one embodiment, a concentration of the first conductive type (for example but not limited to the P-type) impurities of the buried region 41 is higher than a concentration of the first conductive type (for example but not limited to the P-type) impurities of the substrate 27. Apart of the buried region 41 (in this embodiment, for example but not limited to, a lower part of the buried region 41) is located in the substrate 27 in the vertical direction, whereas, another part of the buried region 41 (in this embodiment, for example but not limited to, an upper part of the buried region 41) is located in the epitaxial layer 22 in the vertical direction. As seen from the cross-section view of FIG. 2, at least a part of the buried region 41 is located vertically under the drift buried region 42. Moreover, note that in this embodiment, a length W41 of the buried region 41 is greater than the length W29 of the drain 29. However, in another embodiment, it is also practicable and within the scope of the present invention that the length W41 of the buried region 41 can be equal to the length W29 of the drain 29.

In addition, note that in this embodiment, the length W41 of the buried region 41 is greater than the length W42 of the drift buried region 42. However, in another embodiment, it is also practicable and within the scope of the present invention that the length W41 of the buried region 41 can be equal to the length W42 of the drift buried region 42. That is, in the present invention, the length W41 is greater than or equal to the length W42, which can be represented as: W41≥W42. Note that, in this embodiment, the drift buried region 42 and the buried region 41 are separated by the high voltage well 25. However, in another embodiment, it is also practicable and within the scope of the present invention that the drift buried region 42 and the buried region 41 can be directly connected to each other. That is, in different embodiments, the PN junction PN2 can be formed between the buried region 41 and the high voltage well 25, or the PN junction PN2 can be formed between the buried region 41 and the drift buried region 42. Besides, note that in this embodiment, the drift buried region 42 and the drain 29 are separated by the high voltage well 25. However, in another embodiment, it is also practicable and within the scope of the present invention that the drift buried region 42 and the drain 29 can be directly connected to each other.

The buried region 41, along the channel direction, has a boundary B1 close to the gate 21 and a boundary B2 away from the gate 21. The drift buried region 42, along the channel direction, has a boundary C1 close to the gate 21 and a boundary C2 away from the gate 21. As seen from the cross-section view of FIG. 2, the boundary B1 of the buried region 41 and the boundary C1 of the drift buried region 42, along the channel direction, are located between the drain 29 and the channel junction JN. Besides, the boundary B2 of the buried region 41 and the boundary C2 of the drift buried region 42, along the channel direction, at least extend beyond a boundary M1, in which the boundary M1 is between the drain 29 and an isolation structure 23r close to the drain 29.

It is described in the above that, in one embodiment, the boundary B1 of the buried region 41 and the boundary C1 of the drift buried region 42, along the channel direction, are located between the drain 29 and the channel junction JN, that is, located within a region L1 as indicated in FIG. 2. However, in another embodiment, the boundary B1 of the buried region 41 and the boundary C1 of the drift buried region 42, along the channel direction, can be located within a region L2 which is located vertically under the field oxide region 24 (as indicated in FIG. 2).

Moreover, in one embodiment, the boundary B2 of the buried region 41 and the boundary C2 of the drift buried region 42, along the channel direction, can be located within a region P (as indicated in FIG. 2) which is between the boundary M1 and the boundary M2. Furthermore, the epitaxial layer 22 does not have to be an epitaxial layer. in another embodiment, a substrate can be doped by different conductive type impurities to form the substrate 27 and the layer 22 (which is now a doped region instead of an epitaxial layer). For example, the substrate 27 can be a region of the initial substrate which is doped by first conductive type impurities (for example but not limited to P-type impurities), whereas the layer 22 can be another region of the initial substrate which is doped by second conductive type impurities (for example but not limited to N-type impurities).

The present invention is different from the prior art in that: because the buried region 41 has a first conductive type (for example but not limited to P-type), and the drift buried region 42 and the high voltage well 25 have a second conductive type (for example but not limited to N-type), a PN junction PN2 is formed between the drift buried region 42 and the buried region 41, or between the high voltage well 25 and the buried region 41. And, as described above, the PN junction PN1 is formed between the high voltage well 25 and the top surface 21a of the substrate 27. As shown by the cross-section view of FIG. 2, the PN junction PN2 and the PN junction PN1 have different depths (i.e., H2 and H1, respectively), and the depth H2 of the PN junction PN2 is shallower than the depth H1 of the PN junction PN1, that is, H2<H1. In the context of the present invention, "depth" is defined as a distance extending from the epitaxial surface 22a downward along the vertical direction, In the present invention, there is a PN junction PN2 having a relatively shallower depth H2 at a location close to the drain 29, which is an advantage of the present invention. Because the second conductive type (for example but not limited to N-type) dopant concentration of the drift buried region 42 is higher than the second conductive type dopant concentration of the high voltage well 25, and the first conductive type (for example but not limited to P-type) dopant concentration of the buried region 41 is higher than the first conductive type dopant concentration of the substrate 27, a depletion region is formed around the neighborhood of the PN junction PN2 which is close to the drain 29. This depletion region can cooperate with a lateral depletion region generated by the DMOS device 200 to form a large depletion region, to thereby suppress the high electric field which is formed when the DMOS device 200 is in a non-conduction operation. As a consequence, in the present invention, not only the breakdown voltage of the PN junction PN2 can be increased, but also the conduction resistance of the DMOS device 200 can be reduced.

The prior art, however, does not have a PN junction PN2 having a relatively shallower depth as the present invention does. As compared to the present invention, which includes two PN junctions (i.e., PN junction PN1 and PN junction PN2, wherein the depth H2 of the PN junction PN2 is shallower than the depth H1 of the PN junction PN1), the prior art, however, includes only one single PN junction PN0. Moreover, it is noteworthy that, in the prior art, the depth of the PN junction PN0 close to the drain 19 is the same as the depth of the PN junction PN0 close to the source 18. That is, in the prior art, there is no difference between the depth of the PN junction PN0 close to the drain 19 and the PN junction PN0 close to the source 18.

Please refer to FIGS. 3A~3G, which show an embodiment of a manufacturing method of a DMOS device according to the present invention.

Figure 3A:
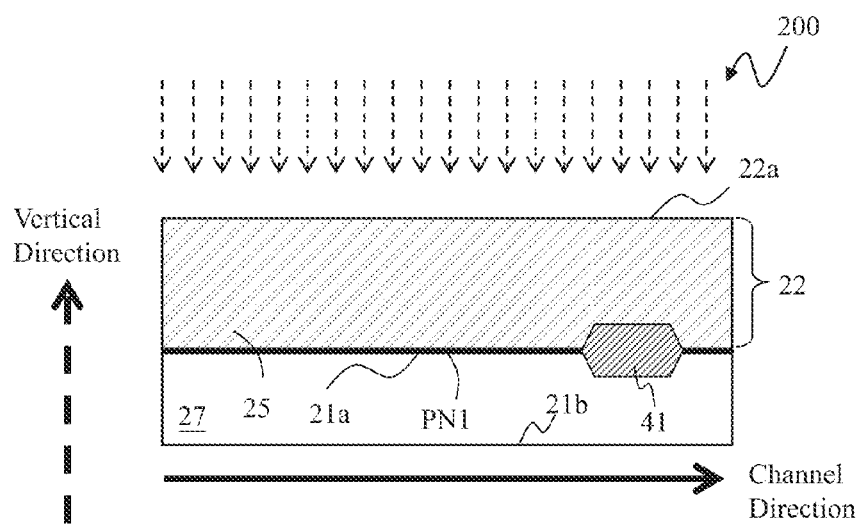
FIGS. 3A~3G show an embodiment of a manufacturing method of a DMOS device according to the present invention.

First, as shown in the cross-section view of FIG. 3A, the substrate 27 having a first conductive type (for example but not limited to P-type) is provided, wherein the substrate 27 is for example but not limited to a P-type silicon substrate (or a P-type semiconductor substrate of another material). The P-type substrate 27 includes a top surface 21a and a bottom surface 21b opposite to the top surface 21a in a vertical direction (as shown by the dash arrow in FIG. 3A). Optionally, at the upper part of the substrate 27, a deep well of the first conductive type can be formed (not shown), to adjust the characteristic of the interface to be formed between the substrate 27 and the high voltage well 25 (to be formed later). Next, as shown in FIG. 3A, an epitaxial layer 22 is formed on the P-type substrate 27. The epitaxial layer 22 includes an epitaxial top surface 22a opposite to the top surface 21a. And, along the vertical direction, the epitaxial layer 22 is stacked on and in contact with the top surface 21a of the substrate 27. Next, for example an ion implantation process step is taken to implant second conductive type impurities in the form of accelerated ions, as indicated by the dash arrow lines shown in FIG. 3A. The high voltage well 25 having the second conductive type (for example but not limited to the N-type) is formed in the epitaxial layer 22, and is stacked on and in contact with the top surface 21a of the substrate 27 in the vertical direction. A PN junction PN1 is formed between the high voltage well 25 and the top surface 21a of the substrate 27. The buried region 41 having the first conductive type (for example but not limited to the P-type) is formed in the substrate 27 and the epitaxial layer 22. A part of the buried region 41 (in this embodiment, for example but not limited to, a lower part of the buried region 41) is located in the substrate 27 in the vertical direction, whereas, another part of the buried region 41 (in this embodiment, for example but not limited to, an upper part of the buried region 41) is located in the epitaxial layer 22 in the vertical direction. In one embodiment, a concentration of the first conductive type (for example but not limited to the P-type) impurities of the buried region 41 is higher than a concentration of the first conductive type (for example but not limited to the P-type) impurities of the substrate 27.

The buried region 41 can be formed, for example but not limited to, by the following steps. First, the location of the buried region 41 is defined by, for example but not limited to, a photoresist mask formed by a lithography process step, and an ion implantation process step implants for example but not limited to P-type impurities to the defined region in the form of accelerated ions. An implanted region of the buried region 41 is formed in the substrate 27. Next, the photoresist mask is removed, and next, after the epitaxial layer 22 is formed, an anneal process step thermally diffuses a portion of the P-type impurities in the implanted region to the epitaxial layer 22, to form the final buried region 41. The above-mentioned steps are well known to those skilled in this art, and therefore, the details thereof are not redundantly explained here.

Figure 3B:
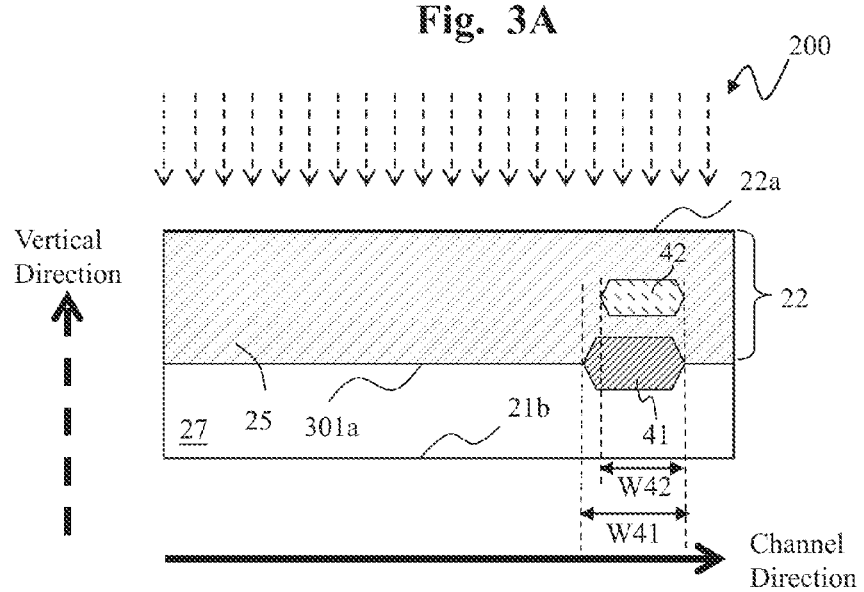

Next, as shown in FIG. 3B, the drift buried region 42 having the second conductive type (for example but not limited to the N-type) is formed in the epitaxial layer 22. In one embodiment, a concentration of the second conductive type (for example but not limited to the N-type) impurities of the drift buried region 42 is higher than a concentration of the second conductive type (for example but not limited to the N-type) impurities of the high voltage well 25.

The drift buried region 42 can be formed, for example but not limited to, by the following steps. First, the location of the drift buried region 42 is defined by, for example but not limited to, a photoresist mask formed by a lithography process step, and an ion implantation process step implants for example but not limited to N-type impurities to the defined region in the form of accelerated ions. An implanted region of the drift buried region 42 is formed in the substrate 27. Next, the photoresist mask is removed, and next, after the epitaxial layer 22 is formed, an anneal process step thermally diffuses a portion of the N-type impurities in the implanted region of the drift buried region 42 to the epitaxial layer 22, to form the final drift buried region 42 is formed. The above-mentioned steps are well known to those skilled in this art, and therefore, the details thereof are not redundantly explained here. As seen from the cross-section view of FIG. 3B, a part of the buried region 41 is located vertically under the drift buried region 42.

It is noteworthy that, as shown in FIG. 3B, in one embodiment, a length W41 of the buried region 41 is greater than a length W42 of the drift buried region 42. However, in another embodiment, it is also practicable and within the scope of the present invention that the length W41 of the buried region 41 can be equal to the length W42 of the drift buried region 42. That is, in the present invention, the length W41 is greater than or equal to the length W42, which can be represented as: W41≥W42.

It should be explained that, the order of the above-mentioned steps for forming the buried region 41 and the drift buried region 42 are interchangeable. The present invention is not limited to first forming the buried region 41 and subsequently forming the drift buried region 42. It is also practicable and within the scope of the present invention to first form the drift buried region 42 and subsequently form the buried region 41.

Figure 3C:
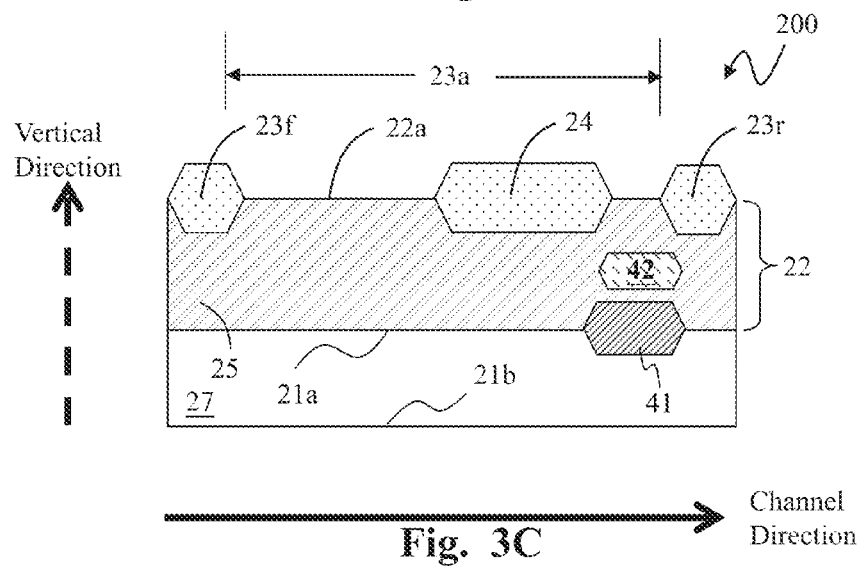

Next, as shown in the cross-section view of FIG. 3C, the isolation structure 23f and the isolation structure 23r are formed on the epitaxial layer 22, for defining the operation region 23a. The field oxide region 24 is formed in the operation region 23a on the epitaxial layer 22 concurrently with or after the formation of the isolation structure 23f and the isolation structure 23r. The field oxide region 24 is stacked on and in contact with the high voltage well 25 in the vertical direction. The isolation structure 23f, the isolation structure 23r and the field oxide region 24 for example can be, but are not limited to, local oxidation of silicon (LOCOS) structures as shown in the figure; in another embodiment, the isolation structure 23f, the isolation structure 23r and the field oxide region 24 can be shallow trench isolation (STI) structures instead.

Figure 3D:
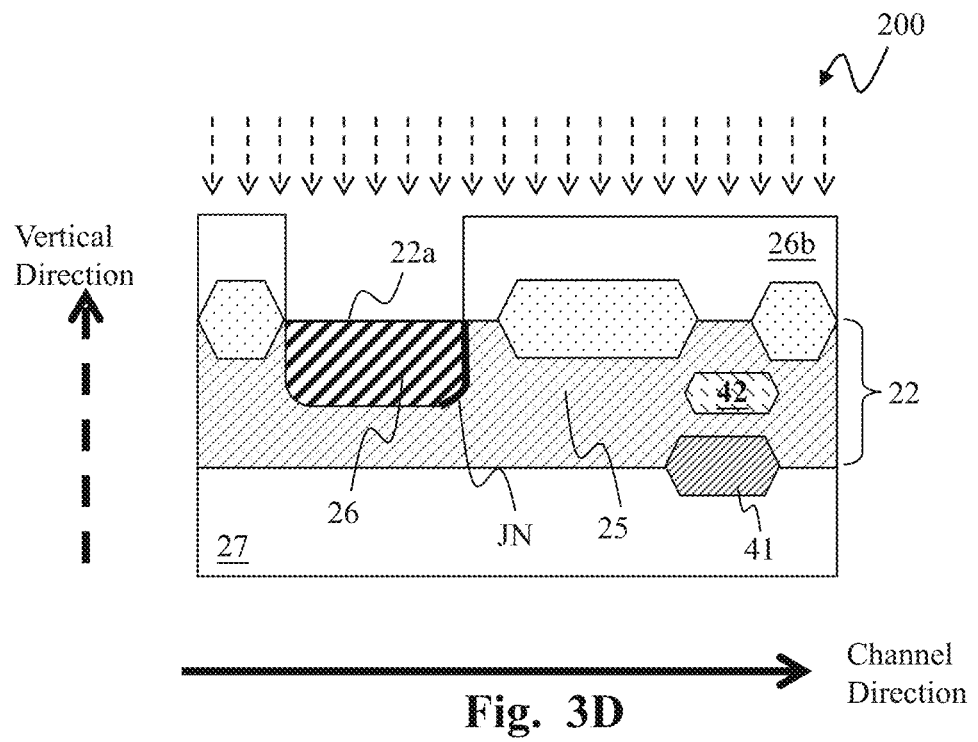

Next, as shown in the cross-section view of FIG. 3D, the body region 26 having the first conductive type (for example but not limited to the P-type) is formed in the epitaxial layer 22 beneath the epitaxial surface 22a, and connects the epitaxial surface 22a in the vertical direction, wherein the body region 26 and the high voltage well 25 form a channel junction JN (as indicated by the thick solid line shown in FIG. 3D) in a channel direction (as indicated by the solid arrow at the lower part of FIG. 3D). The body region 26 is defined by for example but not limited to a photoresist mask 26b formed by a lithography process step, and an ion implantation process step implants for example but not limited to P-type impurities to the defined region in the form of accelerated ions. An implanted region of the body region 26 is formed in the substrate 27. Next, the photoresist mask 26b is removed. A thermal anneal process step can be taken afterward.

Figure 3E:
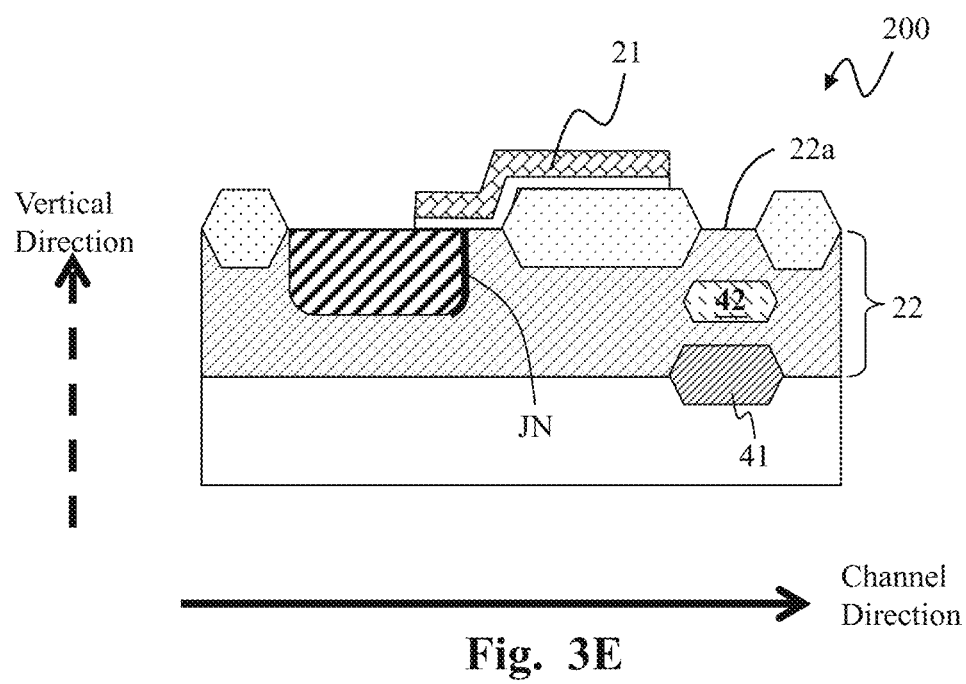

Next, as shown in the cross-section view of FIG. 3E, the gate 21 is formed on the epitaxial layer 22, which is stacked on and in contact with the epitaxial surface 22a of the epitaxial layer 22 in the vertical direction, wherein the gate 21 covers at least a part of the channel junction JN as shown in the cross-section view of FIG. 3E. In this embodiment, the gate 21 covers, for example but not limited to, all of the channel junction JN.

Figure 3F:
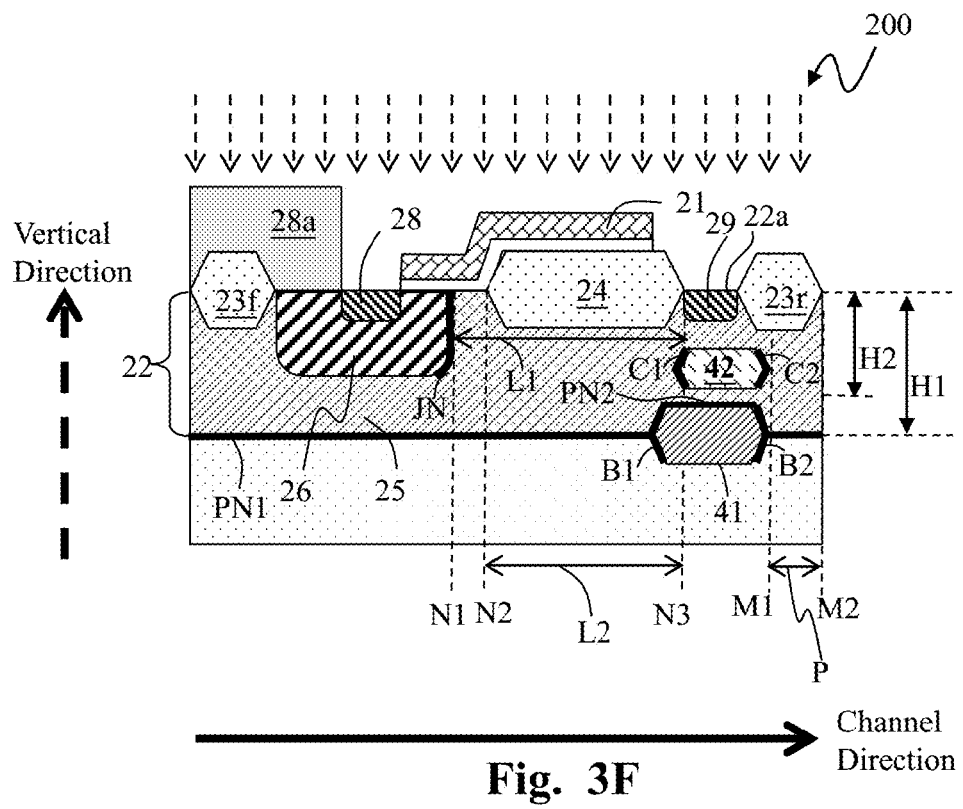

Next, as shown in the cross-section view of FIG. 3F, the source 28 having the second conductive type (for example but not limited to the N-type) is formed in the epitaxial layer 22, and is stacked beneath and connect the epitaxial surface 22a in the vertical direction, wherein the source 28 is located in the body region 26. As shown in the cross-section view of FIG. 3F, the drain 29 having the second conductive type (for example but not limited to the N-type) is formed in the epitaxial layer 22, and is stacked beneath and connects the epitaxial surface 22a in the vertical direction. The source 28 and the drain 29 are located at different sides of the channel junction JN, and the drain 29 and the gate 21 are separated by the high voltage well 25 as shown in the cross-section view of FIG. 3F.

In a conductive operation of the N-type the DMOS device 200, for example, a current flows from the N-type drain 29 through the high voltage well 25 and the body region 26 to the source 28. By applying a positive voltage to the gate 21, a channel is formed whereby in the conductive operation, a current flows from the drain 29 to the source 28. The operation of a DMOS device is well known to those skilled in this art, and therefore it is not explained in detail here.

The source 28 and the drain 29 are formed by for example but not limited to a same lithography process step and a same ion implantation process step. As shown in FIG. 3F, the N-type source 28 and the drain 29 are defined by for example but not limited to the gate 21 together with a photoresist mask 28a formed by the lithography process step, and the ion implantation process step implants for example but not limited to N-type impurities to the defined regions in the form of accelerated ions as indicated by the dash arrow lines shown in FIG. 3F. The N-type source 28 and the N-type drain 29 are formed beneath and connect the epitaxial surface 22a.

It is noteworthy that, in one embodiment, the boundary B1 of the buried region 41 and the boundary C1 of the drift buried region 42, along the channel direction, are located between the drain 29 and the channel junction JN. That is, in one embodiment, the boundary B1 of the buried region 41 and the boundary C1 of the drift buried region 42, along the channel direction, can be located within a region L1 (as indicated in FIG. 3F) which is between the drain 29 and the channel junction JN. However, in another embodiment, it is also practicable and within the scope of the present invention that the boundary B1 of the buried region 41 and the boundary C1 of the drift buried region 42, along the channel direction, can be located within a region L2 which is located vertically under the field oxide region 24 (as indicated in FIG. 3F).

Moreover, it is noteworthy that, in one embodiment, the boundary B2 of the buried region 41 and the boundary C2 of the drift buried region 42, along the channel direction, can be located within a region P (as indicated in FIG. 3F) which is between the boundary M1 and the boundary M2.

As illustrated the cross-section view of FIG. 3F, a PN junction PN1 is formed between the high voltage well 25 and the top surface 21a of the substrate 27, and a PN junction PN2 is formed between the drift buried region 42 and the buried region 41, or between the high voltage well 25 and the buried region 41. As shown in the cross-section view of FIG. 3F, the PN junction PN2 and the PN junction PN1 have different depths (i.e., H2 and H1, respectively), and the depth H2 of the PN junction PN2 is shallower than the depth H1 of the PN junction PN1, that is, H2<H1, wherein "depth" is defined as a distance extending from the epitaxial surface 22a downward along the vertical direction.

Figure 3G:
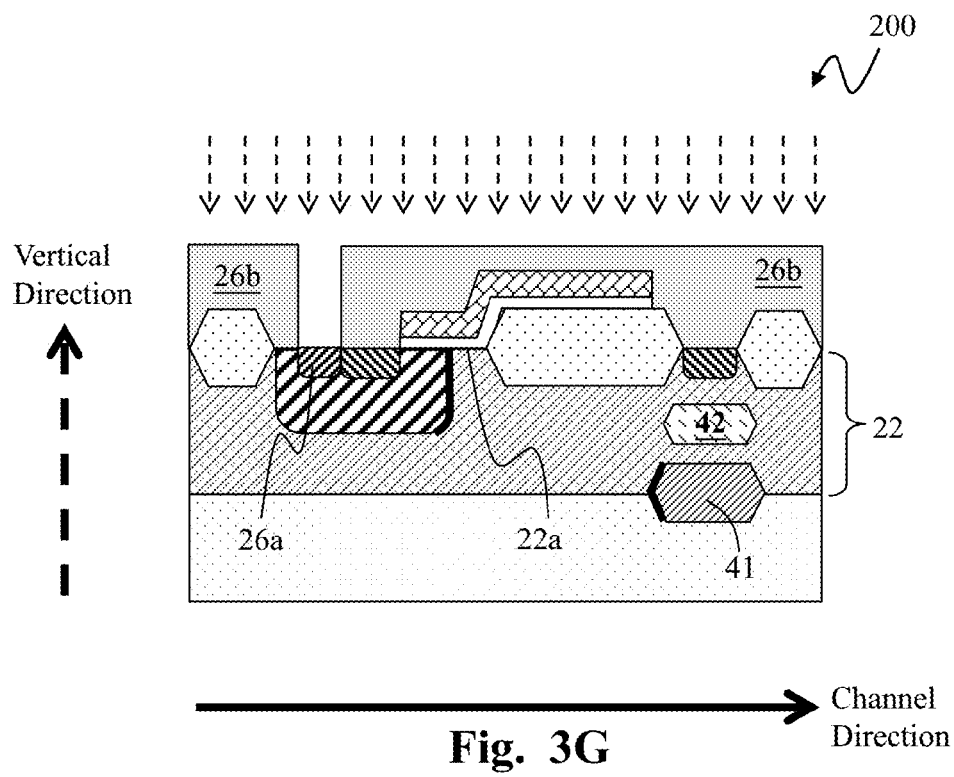

Next, as shown in the cross-section view of FIG. 3G, the body contact region 26a having the first conductive type (for example but not limited to the P-type) is formed in the epitaxial layer 22, and is stacked beneath and connects the epitaxial surface 22a. The body contact region 26a is defined by for example but not limited to a photoresist mask 26b formed by a lithography process step, and an ion implantation process step implants for example but not limited to P-type impurities to the defined region in the form of accelerated ions. An implanted region of the body contact region 26a is formed in the epitaxial layer 22. Next, the photoresist mask 26b is removed, and next, an anneal process step anneals the P-type impurities in the implantation region of the body contact region 26a, to form the body contact region 26a. The implantation and anneal processes are well known to those skilled in this art, and therefore, they are not explained in detail here.

Note that the body region 26 can be formed differently from the above-mentioned embodiments shown in FIG. 2 and FIGS. 3A~3G. In the above-mentioned embodiments, the body region is defined by a photoresist mask, and the channel is correspondingly defined. In another embodiment, the body region can be formed by a self-aligned process, wherein one side of the body region is defined by the polysilicon layer of the gate 21, and the channel is correspondingly defined.

Note that: although the above-mentioned embodiments in FIG. 2 and FIGS. 3A~3G are illustrated by taking an N-type DMOS device as an example, the same technical features can also be applied to a P-type DMOS device. That is, the conductive types of the P-type and the N-type areas (layers, wells or regions, etc.) can be interchanged, to form a device of an opposite conductive type.

Figure 4:
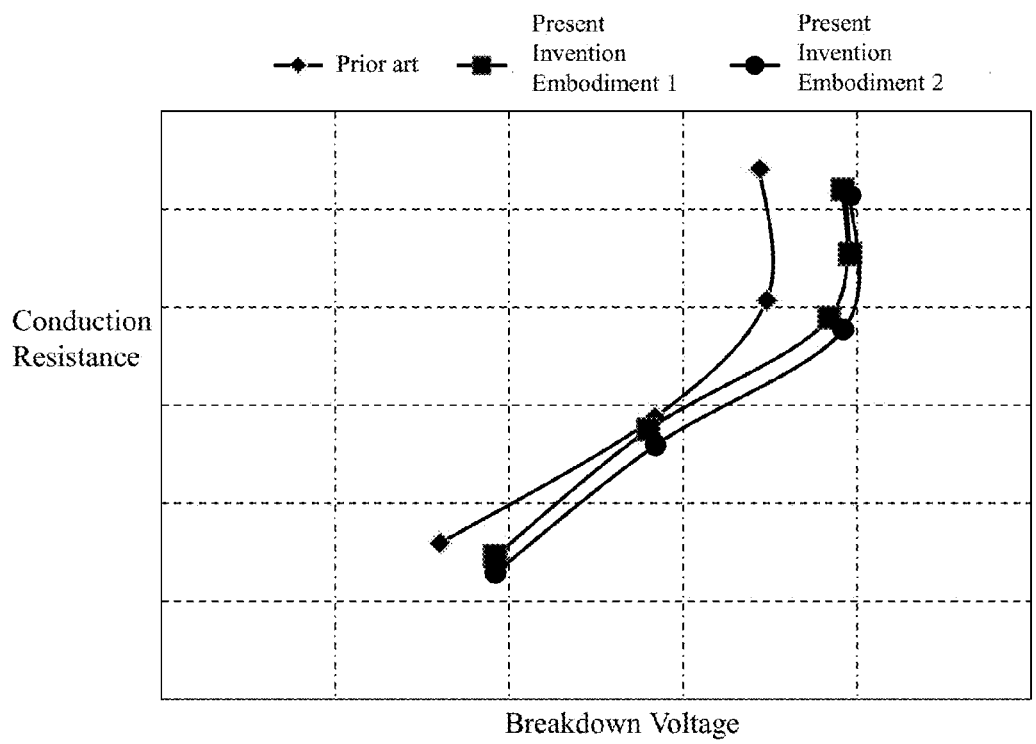
FIGS. 4~6 show, in conjugation with FIG. 2, electric characteristics of a DMOS device of the present invention.
Figure 5:
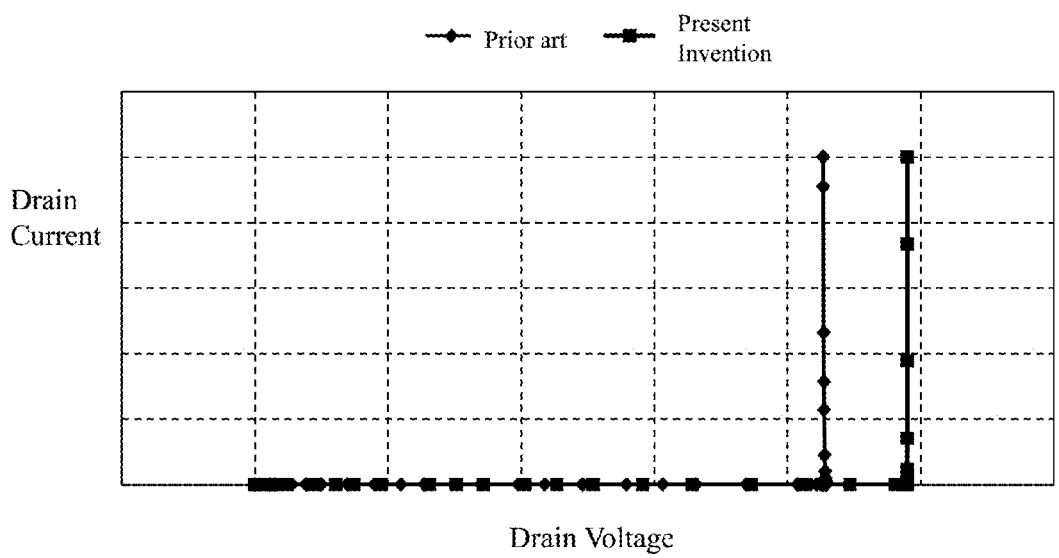
Figure 6:
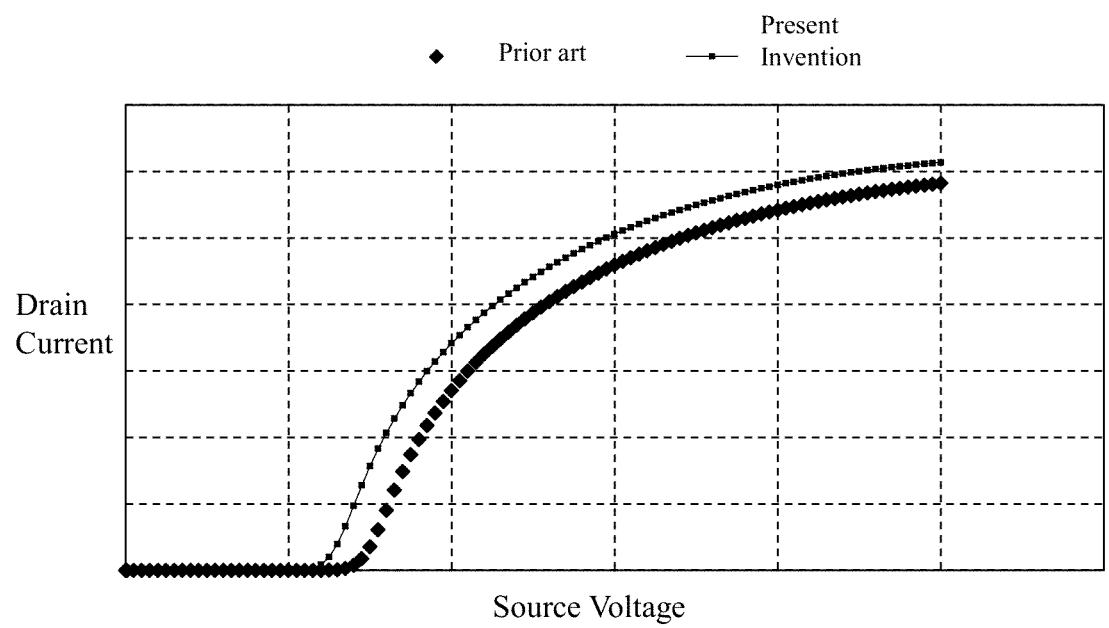

Moreover, please refer to FIGS. 4~6. FIGS. 4~6 show, in conjugation with FIG. 2, characteristics of a DMOS device according to the present invention.

FIG. 4 illustrates that, given the same breakdown voltage of the DMOS device 200 as that of the prior art, the conduction resistance of the DMOS device 200 of the present invention, as compared to the prior art, is remarkably decreased. From another perspective, given the same conduction resistance of the DMOS device 200 as that of the prior art, the breakdown voltage of the DMOS device 200 of the present invention, as compared to the prior art, is remarkably increased. The above clearly shows that the DMOS device 200 of the present invention is advantageous over the prior art both in the non-conduction operation (better breakdown voltage) and in the conduction operation (reduced conduction resistance).

FIG. 5 shows a diagram illustrating the breakdown voltage of the DMOS device 200 of the present invention and that of the prior art. As shown in FIG. 5, the breakdown voltage of the DMOS device 200 of the present invention, as compared to the prior art, is remarkably increased. In addition, FIG. 6 shows a diagram of the conduction characteristic of the DMOS device 200 of the present invention and that of the prior art when they are in a conduction operation. As shown in FIG. 6, when the DMOS device 200 of the present invention and the prior art are in a conduction operation, the DMOS device 200 of the present invention, as compared to the prior art, has a relatively greater level of drain current. In other words, the DMOS device 200 of the present invention not only has an increased breakdown voltage but also has a reduced conduction resistance.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, other process steps or structures which do not affect the primary characteristic of the device, such as a deep well region can be added. For another example, the lithography step described in the above can be replaced by electron beam lithography or other lithography techniques. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A double diffused metal oxide semiconductor (DMOS) device, comprising:
   a substrate having a first conductive type, the substrate having a top surface and a bottom surface opposing to each other along a vertical direction;
   an epitaxial layer, which is formed on the substrate, and has an epitaxial surface opposite to the top surface along the vertical direction, wherein the epitaxial layer is stacked on and in contact with at least a portion of the top surface of the substrate;
   a high voltage well having a second conductive type, which is formed in the epitaxial layer, and is stacked on and in contact with the top surface along the vertical direction, wherein the high voltage well and the top surface of the substrate form a first PN junction;
   a body region having the first conductive type, which is formed in the epitaxial layer beneath the epitaxial surface, and connects the epitaxial surface in the vertical direction, wherein, as seen from a cross-section view, the body region and the high voltage well form a channel junction in a channel direction;
   a gate, which is formed on the epitaxial layer, and is stacked on and in contact with the epitaxial surface in the vertical direction, wherein, as seen from the cross-section view, the gate covers at least a part of the channel junction;
   a source having the second conductive type, which is formed in the epitaxial layer, and is stacked beneath and connects the epitaxial surface in the vertical direction, wherein, as seen from the cross-section view, the source is located in the body region;
   a drain having the second conductive type, which is formed in the epitaxial layer, and is beneath and connects the epitaxial surface in the vertical direction, wherein the source and the drain are located at different sides of the channel junction, and wherein, as seen from the cross-section view, the drain and the gate are separated by the high voltage well;
   a drift buried region having the second conductive type, which is formed in the epitaxial layer, wherein, as seen from the cross-section view, a part of the drift buried region is located vertically under the drain, and wherein a length of the drift buried region is greater than or equal to a length of the drain; and
   a buried region having the first conductive type, which is formed between the substrate and the epitaxial layer, wherein a part of the buried region is located in the substrate and another part of the buried region is located in the epitaxial layer in the vertical direction, wherein, as seen from the cross-section view, at least a part of the buried region is located vertically under the drift buried region, and wherein a length of the buried region is greater than or equal to a length of the drain, and wherein the length of the buried region is greater than or equal to a length of the drift buried region;
   wherein, as seen from the cross-section view, the drift buried region and the buried region, or the high voltage well and the buried region, form a second PN junction along a channel direction;
   wherein, as seen from the cross-section view, the first PN junction and the second PN junction have respective depths, wherein the depth is defined as a distance extending from the epitaxial surface downward along the vertical direction, and the depth of the second PN junction is shallower than the depth of the first PN junction;
   wherein, the drift buried region, along the channel direction, has a first boundary close to the gate and a second boundary away from the gate, and wherein, the buried region, along the channel direction, has a third boundary close to the gate and a fourth boundary away from the gate;
   wherein, the first boundary and the third boundary, along the channel direction, are between the drain and the channel junction, and wherein the second boundary and the fourth boundary, along the channel direction, at least extend beyond a fifth boundary, in which the fifth boundary is between the drain and an isolation structure close to the drain;
   wherein, the isolation structure defines an operation region of the DMOS device.

2. The DMOS device of claim 1, wherein a concentration of the second conductive type impurities of the drift buried region is higher than a concentration of the second conductive type impurities of the high voltage well, and wherein a concentration of the first conductive type impurities of the buried region is higher than a concentration of the first conductive type impurities of the substrate.

3. The DMOS device of claim 1, further comprising:
   a field oxide region, which is formed in the operation region and on the epitaxial layer, and is stacked on and in contact with the high voltage well in the vertical direction, wherein the field oxide region is located between the channel junction and the drain in the channel direction.

4. The DMOS device of claim 3, wherein the first boundary and the third boundary are located vertically under a region which is beneath of the field oxide region.

5. The DMOS device of claim 1, further comprising:
   a body contact region having the first conductive type, which is formed in the epitaxial layer, and is stacked beneath and connects the epitaxial surface in the vertical direction, wherein, as seen from the cross-section view, the body contact region is located in the body region.

6. A manufacturing method of a double diffused metal oxide semiconductor (DMOS) device, comprising:
   providing a substrate having a first conductive type, the substrate having a top surface and a bottom surface opposing to each other along a vertical direction;
   forming an epitaxial layer on the substrate, wherein the epitaxial layer has an epitaxial surface opposite to the top surface along the vertical direction, and wherein the epitaxial layer is stacked on and in contact with at least a portion of the top surface of the substrate;
   forming a high voltage well having a second conductive type in the epitaxial layer, wherein the high voltage well is stacked on and in contact with the top surface along the vertical direction, wherein the high voltage well and the top surface of the substrate form a first PN junction;

forming a body region having the first conductive type in the epitaxial layer, wherein the body region is beneath the epitaxial surface and connects the epitaxial surface in the vertical direction, wherein, as seen from a cross-section view, the body region and the high voltage well form a channel junction in a channel direction;

forming a gate on the epitaxial layer, wherein the gate is stacked on and in contact with the epitaxial surface in the vertical direction, wherein, as seen from the cross-section view, the gate covers at least a part of the channel junction;

forming a source having the second conductive type in the epitaxial layer, wherein the source is stacked beneath and connects the epitaxial surface in the vertical direction, wherein, as seen from the cross-section view, the source is located in the body region;

forming a drain having the second conductive type in the epitaxial layer, wherein the drain is beneath and connects the epitaxial surface in the vertical direction, wherein the source and the drain are located at different sides of the channel junction, and wherein, as seen from the cross-section view, the drain and the gate are separated by the high voltage well;

forming a drift buried region having the second conductive type in the epitaxial layer, wherein, as seen from the cross-section view, a part of the drift buried region is located vertically under the drain, and wherein a length of the drift buried region is greater than or equal to a length of the drain; and forming a buried region having the first conductive type between the substrate and the epitaxial layer, wherein a part of the buried region is located in the substrate and another part of the buried region is located in the epitaxial layer in the vertical direction, wherein, as seen from the cross-section view, at least a part of the buried region is located vertically under the drift buried region, and wherein a length of the buried region is greater than or equal to a length of the drain, and wherein the length of the buried region is greater than or equal to a length of the drift buried region;

wherein, as seen from the cross-section view, the drift buried region and the buried region or the high voltage well and the buried region form a second PN junction along a channel direction;

wherein, as seen from the cross-section view, the first PN junction and the second PN junction have respective depths, wherein the depth is defined as a distance extending from the epitaxial surface downward along the vertical direction, and the depth of the second PN junction is shallower than the depth of the first PN junction;

wherein, the drift buried region, along the channel direction, has a first boundary close to the gate and a second boundary away from the gate, and wherein, the buried region, along the channel direction, has a third boundary close to the gate and a fourth boundary away from the gate;

wherein, the first boundary and the third boundary, along the channel direction, are between the drain and the channel junction, and wherein the second boundary and the fourth boundary, along the channel direction, at least extend beyond a fifth boundary, in which the fifth boundary is between the drain and an isolation structure close to the drain;

wherein, the isolation structure defines an operation region of the DMOS device.

7. The manufacturing method of the DMOS device of claim 6, wherein a concentration of the second conductive type impurities of the drift buried region is higher than a concentration of the second conductive type impurities of the high voltage well, and wherein a concentration of the first conductive type impurities of the buried region is higher than a concentration of the first conductive type impurities of the substrate.

8. The manufacturing method of the DMOS device of claim 6, further comprising:
   forming a field oxide region in the operation region on the epitaxial layer, wherein the field oxide region is stacked on and in contact with the high voltage well in the vertical direction, wherein the field oxide region is located between the channel junction and the drain in the channel direction.

9. The manufacturing method of the DMOS device of claim 8, wherein the first boundary and the third boundary, along the channel direction, are located vertically under a region which is beneath of the field oxide region.

10. The manufacturing method of the DMOS device of claim 6, further comprising:
   forming a body contact region having the first conductive type in the epitaxial layer, wherein the body contact region is stacked beneath and connects the epitaxial surface in the vertical direction, wherein, as seen from the cross-section view, the body contact region is located in the body region.

* * * * *